(12) United States Patent
Byun et al.

(10) Patent No.: US 9,754,678 B2
(45) Date of Patent: Sep. 5, 2017

(54) METHOD OF PROGRAMMING ONE-TIME PROGRAMMABLE (OTP) MEMORY DEVICE AND METHOD OF TESTING SEMICONDUCTOR INTEGRATED CIRCUIT INCLUDING THE SAME

(71) Applicant: Samsung Electronics Co., Ltd., Suwon-si (KR)

(72) Inventors: Do-Hoon Byun, Hwaseong-si (KR); Chang-Su Sim, Suwon-si (KR); Na-Rae Hong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/099,902

(22) Filed: Apr. 15, 2016

(65) Prior Publication Data

US 2017/0040067 A1    Feb. 9, 2017

(30) Foreign Application Priority Data

Aug. 3, 2015  (KR) .......................... 10-2015-0109466

(51) Int. Cl.
  *G11C 17/00* (2006.01)
  *G11C 17/18* (2006.01)
  *G11C 17/16* (2006.01)

(52) U.S. Cl.
  CPC .............. *G11C 17/18* (2013.01); *G11C 17/16* (2013.01)

(58) Field of Classification Search
  CPC ...... G11C 17/16; G11C 17/18; H01L 23/5252

USPC .................................................... 365/96, 201
See application file for complete search history.

(56) References Cited

U.S. PATENT DOCUMENTS

| | | | |
|---|---|---|---|
| 7,046,569 B2 | 5/2006 | Ito et al. | |
| 7,257,012 B2 | 8/2007 | Nakayama et al. | |
| 7,508,693 B2 | 3/2009 | Chen | |
| 7,885,117 B2 | 2/2011 | Shin et al. | |
| 8,213,211 B2 | 7/2012 | Kurjanowicz | |
| 8,266,483 B2 | 9/2012 | Kurjanowicz | |
| 8,913,449 B2 | 12/2014 | Chung | |
| 8,917,533 B2 | 12/2014 | Chung | |
| 2011/0267869 A1* | 11/2011 | Hoefler | G11C 17/18 365/96 |
| 2012/0092916 A1* | 4/2012 | Lee | G11C 17/18 365/96 |

FOREIGN PATENT DOCUMENTS

KR    100816160    6/2007
KR    1020140110579    9/2014

* cited by examiner

*Primary Examiner* — Son Dinh
(74) *Attorney, Agent, or Firm* — Onello & Mello, LLP.

(57) ABSTRACT

A method of testing a semiconductor integrated circuit including a one-time programmable (OTP) memory device is provided. A program command is transferred from a tester to the OTP memory device. Programming and a programming verification are performed with respect to OTP memory cells in the OTP memory device in response to the program command. The OTP device generates accumulated verification result signal by accumulating program verification results with respect to the OTP memory cells. The accumulated verification result signal is transferred from the OTP memory device to the tester.

20 Claims, 19 Drawing Sheets

METHOD OF PROGRAMMING ONE-TIME PROGRAMMABLE (OTP) MEMORY DEVICE AND METHOD OF TESTING SEMICONDUCTOR INTEGRATED CIRCUIT INCLUDING THE SAME

CROSS-REFERENCE TO RELATED APPLICATION

This U.S. Non-provisional application claims priority under 35 USC §119 to Korean Patent Application No. 10-2015-0109466, filed on Aug. 3, 2015, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a method of programming and testing a one-time programmable (OTP) memory device.

2. Discussion of the Related Art

Among memory devices for storing data, non-volatile memory devices may retain the stored data even if the power to the memory device is off. For example, non-volatile memory devices may include read only memory (ROM), a magnetic memory, optical memory, flash memory, etc. Non-volatile memory devices within which, once the data are written or programmed, the data cannot be altered may be referred to as a one-time programmable (OTP) memory. After the data are programmed in the OTP memory cell, the structure of the OTP memory cell is changed irreversibly and the data, '0' or '1,' may be stored in the OTP memory cell. The OTP memory device may be used variously as an embedded non-volatile storage for storing information on repair of other devices, analog trimming, security codes, for example.

SUMMARY

In example embodiments in accordance with principles of inventive concepts, a method of testing a semiconductor integrated circuit including a one-time programmable (OTP) memory device, is capable of reducing a test time.

In example embodiments in accordance with principles of inventive concepts, a method of programming an OTP memory device, is capable of being performed efficiently in association with an external device such as a tester.

In example embodiments in accordance with principles of inventive concepts, a method of testing a semiconductor integrated circuit including a one-time programmable (OTP) memory device is provided. A program command is transferred from a tester to the OTP memory device. A program and a program verification are performed with respect to OTP memory cells in the OTP memory device in response to the program command. An accumulated verification result signal is generated by accumulating program verification results with respect to the OTP memory cells, by the OTP memory device. The accumulated verification result signal is transferred from the OTP memory device to the tester. A reprogram of the OTP memory cells is determined based on the accumulated verification result signal, by the tester.

In example embodiments in accordance with principles of inventive concepts, the accumulated verification result signal may be a one-bit signal having a first logic level when the program is failed with respect to at least one of the OTP memory cells and having a second logic level when the program is successful with respect to all of the OTP memory cells.

In example embodiments in accordance with principles of inventive concepts, determining the reprogram of the OTP memory cells may include, when the accumulated verification result signal has a first logic level, comparing a current program count with a maximum program count, when the current program count is smaller than the maximum program count, retransferring the program command from the tester to the semiconductor integrated circuit and when the current program count is equal to the maximum program count, determining a program fail of the OTP memory cells.

In example embodiments in accordance with principles of inventive concepts, determining the reprogram of the OTP memory cells may further include, when the accumulated verification result signal has a second logic level, determining a program success of the OTP memory cells.

In example embodiments in accordance with principles of inventive concepts, generating the accumulated verification result signal may include accumulating the program verification results using a latch.

In example embodiments in accordance with principles of inventive concepts, the program, the program verification and the accumulation of the program verification results may be performed sequentially with changing a current program address.

In example embodiments in accordance with principles of inventive concepts, generating the accumulated verification result signal may include performing a logical operation on a current verification result signal and a stored value of the latch, where the current verification result signal represents the program verification result with respect to the current program address and the stored value corresponds to the accumulated verification result signal and updating the stored value of the latch based on a result of the logical operation.

In example embodiments in accordance with principles of inventive concepts, performing the program and the program verification may include, with respect to the current program address, programming one OTP memory cell based on program data of one bit, generating read data of one bit by reading out a stored value of the programmed one OTP memory cell and generating the current verification result signal by comparing the program data of one bit and the read data of one bit.

In example embodiments in accordance with principles of inventive concepts, performing the program and the program verification may include, with respect to the current program address, programming N OTP memory cells based on program data of N bits where N is a positive integer greater than one, generating read data of N bits by reading out stored values of the programmed N OTP memory cells, comparing the program data of N bits and the read data of N bits and generating the current verification result signal by performing a logical operation on the comparison result.

In example embodiments in accordance with principles of inventive concepts, the OTP memory cells may include main cells and redundant cells, and one main cell and one redundant cell corresponding to a same address represent one bit.

In example embodiments in accordance with principles of inventive concepts, generating the accumulated verification result signal may include generating a main accumulated signal by accumulating the verification results with respect to the main cells and generating a redundant accumulated signal by accumulating the verification results with respect to the redundant cells.

In example embodiments in accordance with principles of inventive concepts, generating the accumulated verification result signal may further include generating the accumulated verification result signal by performing a logical operation on the main accumulated signal and the redundant accumulated signal.

In example embodiments in accordance with principles of inventive concepts, the accumulated verification result signal may represent a program success when at least one of the main accumulated signal and the redundant accumulated signal represents a program success.

In example embodiments in accordance with principles of inventive concepts, the one main cell and the one redundant cell corresponding to the same address may be respectively connected to a main word line and a redundant word line and commonly connected to a same bit line. The main word line and the redundant word line corresponding to the same address may be activated simultaneously during normal read and activated independently during the program and the program verification.

In example embodiments in accordance with principles of inventive concepts, a method of programming a one-time programmable (OTP) memory device, includes, performing a program and a program verification with respect to OTP memory cells in the OTP memory device in response to a program command received from an external device, generating an accumulated verification result signal by accumulating program verification results with respect to the OTP memory cells at the OTP memory device and transferring the accumulated verification result signal from the OTP memory device to the external device.

In example embodiments in accordance with principles of inventive concepts, the method of programming the OTP memory device and the method of testing the semiconductor memory device including the OTP memory device according to example embodiments may enhance efficiency in programming the OTP memory device and reduce a test time of the semiconductor integrated circuit including the OTP memory device by accumulating the program verification results using the accumulator of a small size such as a latch to provide the accumulated result to an external device such as a tester.

In example embodiments in accordance with principles of inventive concepts, a method of programming an integrated circuit that includes one-time programmable memory, includes the integrated circuit attempting to program the one-time programmable memory up to a predetermined maximum number of times in response to a command from test equipment; and the integrated circuit providing an indication of successful programming to the test equipment before the maximum number of programming attempts have been executed.

In example embodiments in accordance with principles of inventive concepts, a method of programming an integrated circuit includes test equipment proceeding with further testing when the indication of successful programming is received from the integrated circuit.

In example embodiments in accordance with principles of inventive concepts, a method of programming an integrated circuit includes the integrated circuit providing an indication of failed programming to the test equipment when the maximum number of programming attempts have been executed without successfully programming the integrated circuit.

In example embodiments in accordance with principles of inventive concepts, a method of programming an integrated circuit includes the integrated circuit determining the success or failure of a programming operation by comparing programming data to data read back from a memory cell that the integrated circuit attempted to program with the data.

In example embodiments in accordance with principles of inventive concepts, a method of programming an integrated circuit includes the integrated circuit providing the indication of successful programming in a one-bit signal.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
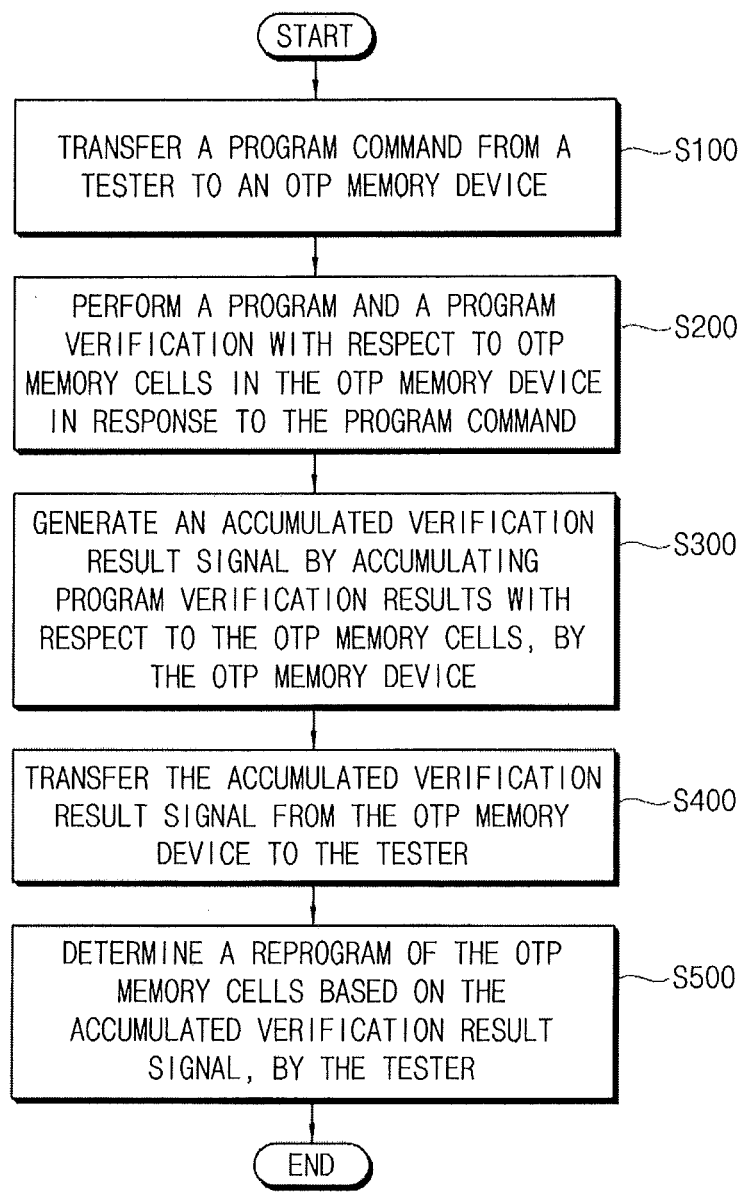
FIG. 1 is a flow chart illustrating a method of testing a semiconductor integrated circuit including a one-time programmable (OTP) device according to example embodiments.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this disclosure will be thorough and complete, and will fully convey the scope of inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
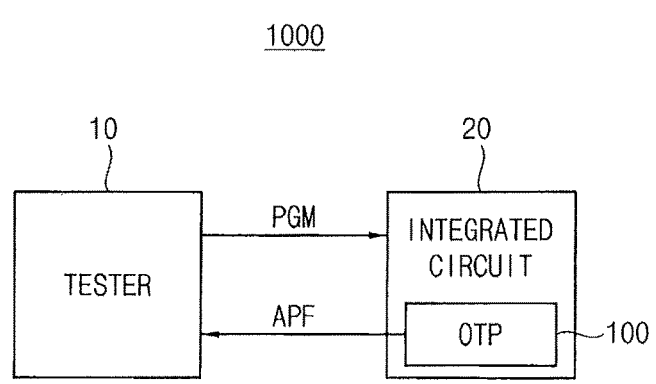
FIG. 2 is a block diagram illustrating a test system according to example embodiments.

FIG. 1 is a flow chart illustrating a method of testing a semiconductor integrated circuit including a one-time programmable (OTP) device according to example embodiments, and FIG. 2 is a block diagram illustrating a test system according to example embodiments.

Referring to FIGS. 1 and 2, a test system 1000 may include a tester 10 and a semiconductor integrated circuit 20. The semiconductor integrated circuit 20 may include an OTP memory device 100.

The tester 10 may transfer a program command PGM to semiconductor integrated circuit 10 including the OTP memory device 100 (S100). The OTP memory device 100 may perform a program and a program verification with respect to OTP memory cells in the OTP memory device 100 in response to the program command PGM (S200). The tester 10 may provide program information such as program data and a program address to the semiconductor integrated circuit 20 with the program command PGM. In some example embodiments, the program command PGM and the program information may be provided directly to the OTP memory device 100. In other example embodiments, the program command PGM and the program information may be provided to a processor such as a central processing unit (CPU) controlling overall operations of the semiconductor integrated circuit 20 and the processor may generate internal signals based on the program command PGM and the program information to control the program of the OTP memory device 100, for example.

The OTP memory device 100 may generate an accumulated verification result signal APF by accumulating verification results with respect to the OTP memory cells (S300). The OTP memory device 100 may transfer the accumulated verification result signal APF to the tester 10 (S400). In some example embodiments, as will be described below, the OTP memory device 100 may accumulate the program verification results using a latch and may generate the accumulated verification result signal APF corresponding to a stored value of the latch. For example, the accumulated verification result signal APF may be a one-bit signal having a first logic level (e.g., a logic high level) when the program is failed with respect to at least one of the OTP memory cells and having a second logic level (e.g., a logic low level) when the program is successful with respect to all of the OTP memory cells.

The tester 10 may attempt to reprogram the OTP memory cells if the original attempt at programming fails, as indicated by the accumulated verification result signal APF. Conventional test methods attempt program the device a predetermined number of times, which may include attempts after the device has been successfully programmed and which, as a result, may require an excessive test time. With smart algorithm programming, the program time may be reduced by performing the program with a necessary program number with program verification until the program is successful. However, with smart algorithm programming, the programming is controlled inside the semiconductor integrated circuit 20 including the OTP memory device 100 and the tester 10 receives no indication that programming is completed and stands by for an excessive wait time regardless of the real program time. If the program time is reduced to reduce the excessive wait time, reliance of the OPT program may be degraded.

The OTP memory devices have to be programmed with different program data with respect to the different semiconductor integrated circuits and thus the program verification has to be performed by securing respective program vectors. In general, the test of the OTP memory is performed together with the logic using the OTP data for the problem of the test time. In this case, when test fail occurs, it is unclear that the fail is due to the OTP memory or due to the logic.

A method of programming the OTP memory device and the method of testing the semiconductor memory device including the OTP memory device according to example embodiments may enhance efficiency in programming the OTP memory device and reduce a test time of the semiconductor integrated circuit including the OTP memory device by accumulating the program verification results using an accumulator, which may be a relatively small accumulator, such as a latch, to provide the accumulated result to an external device such as a tester.

Figure 3:
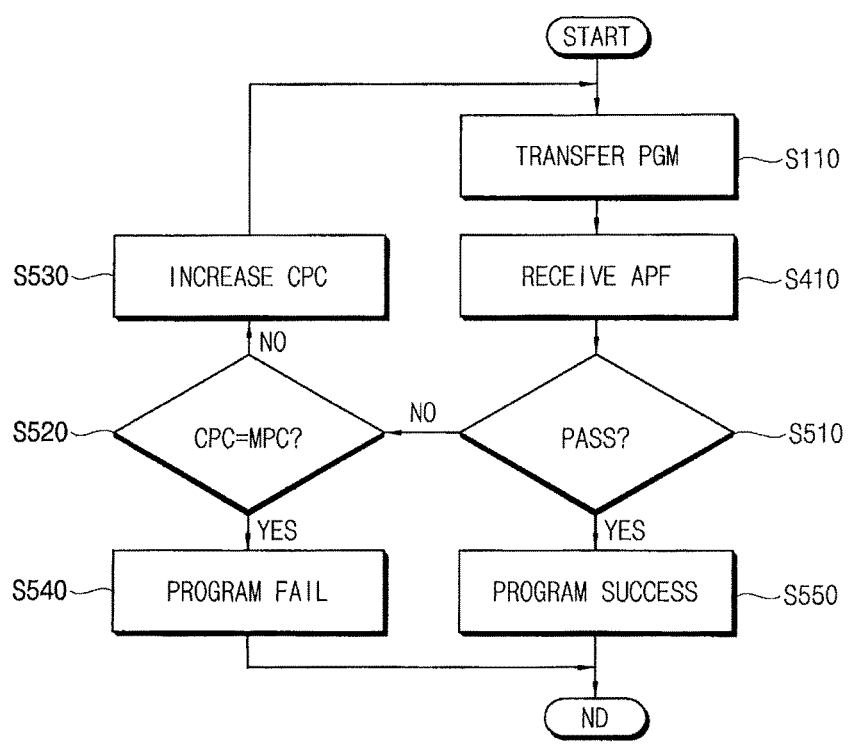
FIG. 3 is a flow chart illustrating a test method by a tester included in the test system of FIG. 2.

FIG. 3 is a flow chart illustrating an example embodiment of a test method in accordance with principles of inventive concepts by a tester such as that included in the test system of FIG. 2.

Referring to FIGS. 2 and 3, the tester 10 may transfer the program command PGM to the semiconductor integrated circuit 20 (S110) and receive the accumulated verification result signal APF from the OTP memory device 100 (S410). The tester 10 may determine pass or fail of the program based on the accumulated verification result signal APF (S510). That is, tester 10 may employ test result signal APF to determine whether the OTP device 100 has been successfully programmed. As described above, the accumulated verification result signal APF may be a one-bit signal and the tester 10 may determine program success (pass) or program fail based on the logic level of the accumulated verification result signal APF.

When the accumulated verification result signal APF has a first logic level, that is, when the accumulated verification result signal APF represents the program fail (S510: NO), the tester 10 may compare a current program count CPC with a maximum program count MPC (S520). The current program count CPC represents a number of the repeated program (that is, the number of attempts that have been made to program the OTP) and the maximum program count MPC represents a fixed number that is predetermined in the tester 10.

When the current program count CPC is smaller than the maximum program count MPC (S520: NO), the tester 10 may increase the current program count CPC by one (S530) and retransfer the program command PGM to the semiconductor integrated circuit 20 (S110). When the current program count CPC is equal to the maximum program count MPC (S520: YES), the tester 10 may determine the program fail of the OTP memory cells (S540).

When the accumulated verification result signal APF has a second logic level, that is, when the accumulated verification result signal APF represents the program success (S510: YES), the tester 10 may determine the program success of the OTP memory cells (S550), that is, that the OTP has been successfully programmed.

As such, the tester 10 may determine the number of the repeated program adaptively based on the accumulated verification result signal APF and may enhance the reliability and reduce the test time of the OTP memory device 100 and the semiconductor integrated circuit 20 including the OTP memory device 100.

Figure 4:
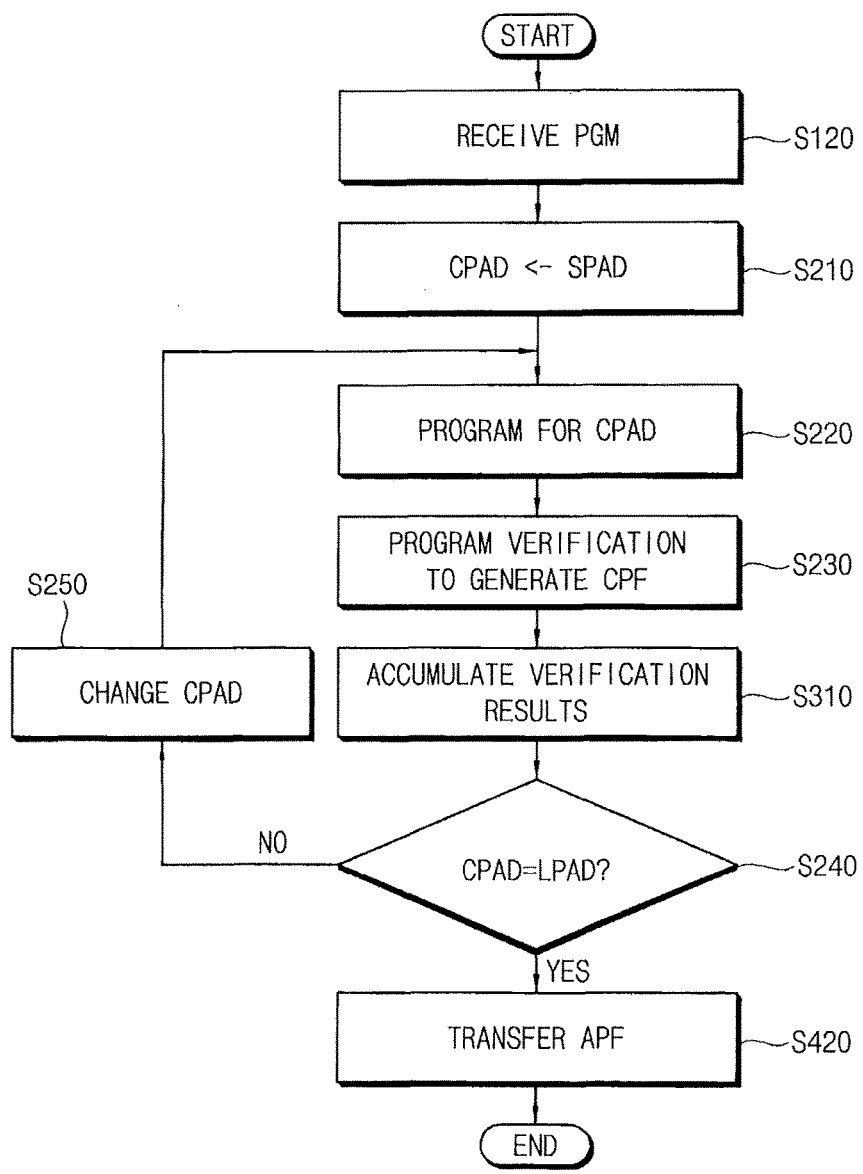
FIG. 4 is a flow chart illustrating a method of programming an OTP memory device included in the test system of FIG. 2.

FIG. 4 is a flow chart illustrating a method of programming an OTP memory device included in the test system of FIG. 2.

Referring to FIGS. 2 and 4, the OTP memory device 100 may receive the program command PGM from the tester 10 (S120). The OTP memory device 100 may receive a range of data, including the program address, program data, etc. with the program command PGM from the tester 10.

The OTP memory device 100 may set a current program address CPAD to a start program address SPAD (S210). The current program address CPAD may include a row address and a column address and an OTP memory cell connected to a word line corresponding to the row address and a bit line corresponding to the column address may be determined to be programmed currently.

The OTP memory device 100 may perform the program with respect to the current program address CPAD (S220). The program may be performed by applying predetermined voltages to the word line and the bit line corresponding to the current program address CPAD, for example, as will be described below.

The OTP memory device 100 may generate the current verification result signal CPF (S230) in the course of performing a program verification. The program verification may be performed by comparing the program data DI and the read data DO as will be described below.

The OTP memory device 100 may accumulate the program verification results based on the current verification result signal CPF (S310). The accumulation of the program verification results may be performed by performing a logical operation on the current verification result signal CPF and a stored value of the latch and updating the stored value of the latch based on a result of the logical operation as will be described below. The current verification result signal CPF may represent the program verification result with respect to the current program address, and the stored value of the latch may correspond to the accumulated verification result signal APF, for example.

When the current program address CPAD is not equal to a last program address LPAD (S240: NO), the OTP memory device 100 may change the current program address (CPAD) (S250) and repeat the above-described program (S220), the program verification (S230) and the accumulation of the program verification results (S310). When the current program address CPAD is equal to the last program address LPAD (S240: YES), the OTP memory device 100 may transfer the accumulated verification result signal APF to the tester 10 (S420), and the tester 10 may determine the reprogramming of the OTP memory cells based on the accumulated verification result signal APF.

As such, the OTP memory device 100 may repeat the program, the program verification and the accumulation of the program verification results sequentially while changing the current program address CPAD from the start program address SPAD to the last program address LPAD. The change of the current program address CPAD may be performed variously. For example, when one OTP memory cell is programmed at one time, the one-bit program may be performed repeatedly by changing the column address while the row address is fixed. If the program is completed with respect to the current row address, the row address may be changed and then the one-bit program may be performed repeatedly by changing the column address. In some example embodiments, a plurality of OTP memory cells may be programmed simultaneously, as will be described with reference to FIGS. 12 and 13.

Figure 5:
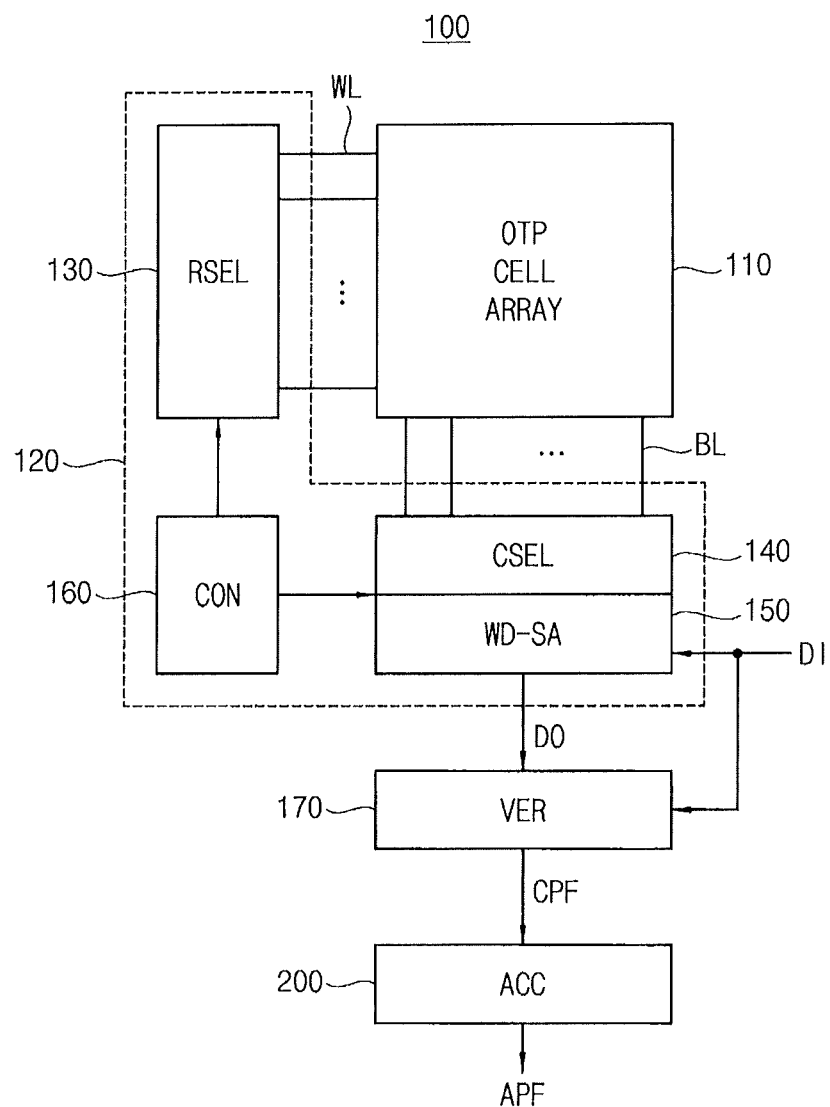
FIG. 5 is a block diagram illustrating an OTP memory device according to example embodiments.

FIG. 5 is a block diagram illustrating an OTP memory device according to example embodiments.

Referring to FIG. 5, an OTP memory device 100 may include a memory cell array 110, a driving unit 120, a verifying unit VER 170 and an accumulating unit ACC 200. The driving unit 120 may include a row selection circuit RSEL 130, a column selection circuit CSEL 140, a read-write circuit WD-SA 150 and a controller CON 160.

The memory cell array 110 may include a plurality of OTP memory cells that are coupled to a plurality of bit lines BL and a plurality of word lines WL, respectively. As will be described with reference to FIG. 6, each word line WL may include a voltage word line WLP and a read word line WLR.

The row selection circuits 130 may include a row decoder for selecting a word line WL corresponding to a row address and a voltage driver for providing various voltages applied to the word lines WL. The column selection circuit 140 may include a column gate circuit and a column decoder for selecting a bit line corresponding to a column address. The column decoder may generate column selection signals based on the column address and a column selection enable signal. The column gate circuit may include a plurality of switches that are turned on selectively in response to the column selection signals. The switch corresponding to the column address may be turned on to select the bit line BL.

The read-write circuit 150 may be connected to the bit lines BL via the column selection circuit 140. The read-write circuit 16 may include a read sense amplifier SA and a write driver WD. The read sense amplifier SA may perform a read operation for sensing the data stored in the OTP memory cells and providing the read data. The write driver WD may perform a write operation for storing the write data into the OTP memory cells. The write driver WD and the read sense amplifier SA may be formed inseparably or separably.

The controller 160 may provide control signals, including a row address signal, a column address signal, etc., to control overall operations of the OTP memory device 100. In an example embodiment, the controller 160 may be implemented as a logic circuit dedicated to the OTP memory device 100. In another example embodiment, at least a portion of the controller 160 may be included in the other processor in the semiconductor integrated circuit 20.

The verifying unit 170 may generate a current verification result signal CPF by comparing program data DI and read data DO. The verifying unit 170 may include a comparator configured to determine whether the two bits corresponding to the program data DI and the read data DI are equal to each other or not. In an example embodiment, the comparator may be implemented as an exclusive OR (XOR) logic gate.

The accumulating unit 200 may generate an accumulated verification result signal APF by accumulating the program verification results based on the current verification result signal CPF. The accumulating unit 200 may include a latch and a logic gate configured to store a value corresponding to the accumulated verification result signal APF as will be described below. The logic gate may accumulate the program verification results by performing a logic operation on the current verification results signal CPF representing the program verification result with respect to the current program address CPAD and the stored value of the latch.

Figure 6:
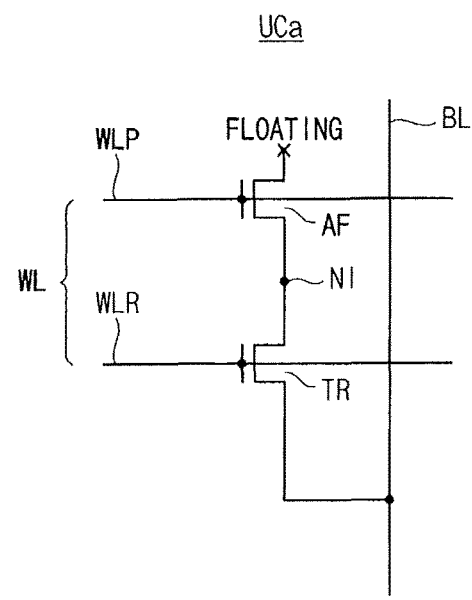
FIG. 6 is a circuit diagram illustrating an example of an OTP cell included in the OTP memory device of FIG. 5.

FIG. 6 is a circuit diagram illustrating an example of an OTP cell included in the OTP memory device of FIG. 5.

Referring to FIG. 6, in an example embodiment an OTP memory cell UCa may include an antifuse AF and a read transistor TR.

The antifuse AF may be connected between a corresponding voltage word line WLP and an intermediate node NI. The read transistor TR may be connected between the intermediate node NI and a corresponding bit line BL.

The antifuse AF may be implemented with a metal oxide semiconductor (MOS) transistor. In an example embodiment, as illustrated in FIG. 6, a drain electrode of the MOS transistor AF may be floated, a source electrode of the MOS transistor AF may be connected to the intermediate node NI and a gate electrode of the MOS transistor AF may be connected to the voltage word line WLP.

The antifuse AF, which is an example element of the OTP memory cell, may have an electrical feature opposite to a typical fuse such that the antifuse AF has a higher resistance value in an unprogrammed state and a lower resistance value in a programmed state.

The antifuse AF may have a structure such that dielectric material is included between two conductors. The dielectric material may be broken and programmed by applying a high voltage between the two conductors for a sufficient time. As a result of the program, the two conductors are electrically connected through the broken dielectric material and thus the antifuse AF may have the lower resistance value. As one of the antifuse type OTP memory, the MOS capacitor having a thin gate oxide may be used as the antifuse AF and the high voltage may be applied between the two electrodes of the MOS capacitor to program the MOS capacitor. An OTP memory cell using a MOS capacitor may have a smaller cell area and a lower program current than other embodiments and, as a result, low power and byte-wide programming may be achieved.

A program voltage VPGM of relatively a high voltage level may be applied to the voltage word line WLP in a program mode and read voltage VRD having a lower voltage level than the program voltage VPGM may be applied to the voltage word line WLP in a read mode. A selection voltage having a voltage level enough to turn on the read transistor TR may be applied to the read word line WLR in the program and read modes.

In the program mode, a program permission voltage VPER may be applied to the bit lines connected to the OTP memory cells to be programmed, and a program inhibition voltage VINH higher than the program permission voltage VPER may be applied to the bit lines connected to the OTP memory cells not to be programmed. For example, the program permission voltage VPER may be set to the ground voltage VSS, and/or the program inhibition voltage VINH and the read voltage VRD may be set to the power supply voltage. The voltage levels of the program voltage VPGM, the read voltage VRD, the program permission voltage VPER and the program inhibition voltage VINH may be set variously depending on the characteristics of the OTP memory cells and the configuration of the OTP memory device.

The program of the antifuse AF may be performed in the program mode such that the program voltage VPGM is applied to the voltage word line WLP, the selection voltage is applied to the read word line WLR to turn on the read transistor TR and the program permission voltage VPER is applied to the bit line BL, for example.

Figure 7:
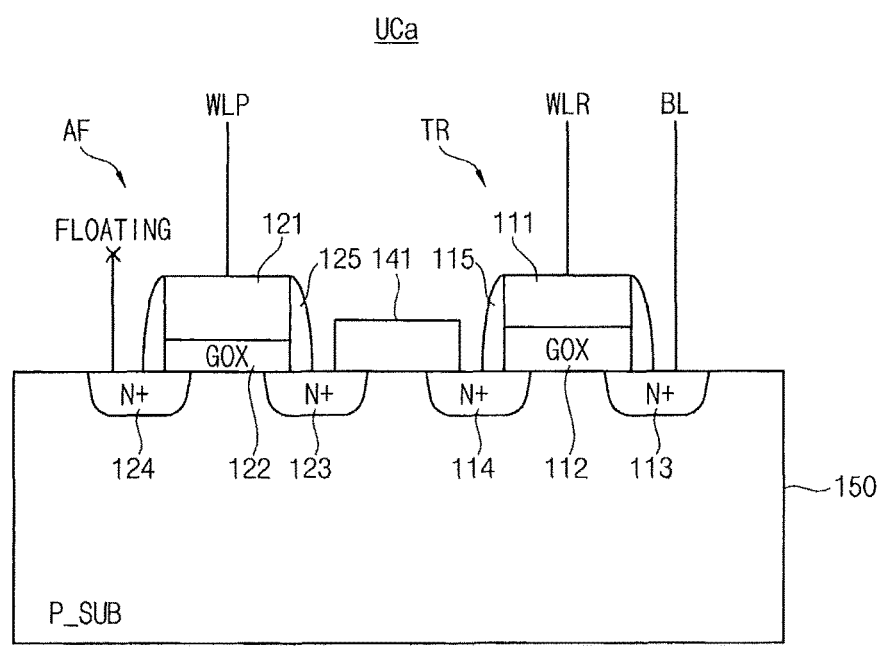
FIG. 7 is a cross-sectional diagram illustrating an example structure of the OTP cell of FIG. 6.

FIG. 7 is a cross-sectional diagram illustrating an example structure of an OTP cell such as that of FIG. 6.

Referring to FIG. 7, a memory cell UCa may include an antifuse AF and a read transistor TR that are formed on a same substrate P-SUB 150.

The read transistor TR may include a first gate 111 connected to a corresponding read word line WLR, a first gate insulation layer GOX 112 insulating the first gate 111 from the substrate 150, a first source region 113 connected to a corresponding bit line BL and a first drain region 114.

The antifuse AF may include a second gate 121 connected to a corresponding voltage word line WLP, a second gate insulation layer 122 insulating the second gate 121 from the substrate 150, a second source region 123 connected to the first drain region 114 of the read transistor TR and a second drain region 124 that is floated.

The second source region 123 of the antifuse AF may be electrically connected to the first drain region 114 of the read transistor TR by a conduction path 141. The conduction path 141 may include metal lines formed in an upper space and interlayer structure such as vias for connecting the metal lines to the upper surface of the substrate 150. In some example embodiments, the second source region 123 of the antifuse AF and the first drain region 114 of the read transistor TR may be combined and, in such cases, the conduction path 141 may be omitted.

For example, the substrate 150 may be doped with P-type impurities, and the source regions 113 and 123 and the drain regions 114 and 124 may be doped with N-type impurities.

The read transistor TR may further include a first spacer 115 formed on sidewalls of the first gate 111 and the first gate insulation layer 112. The antifuse AF may further include a second spacer 125 formed on sidewalls of the second gate 121 and the second gate insulation layer 122.

Hereinafter, processes of manufacturing the OTP memory cell UCa are described briefly.

The first gate insulation layer 112, the second gate insulation layer 122 and the third insulation layer 132 may be formed on the substrate 150. The first gate 111 may be formed on the first gate insulation layer 112 and the second gate 121 may be formed on the second gate insulation layer 122. The source regions 113 and 123 and the drain regions 114 and 124 may be formed by an ion implantation process, which implants N-type impurities into both sides of the first gate 111 and the second gate 121. After that, the spacers 115 and 125 and the conduction path 141 may be formed.

Figure 8:
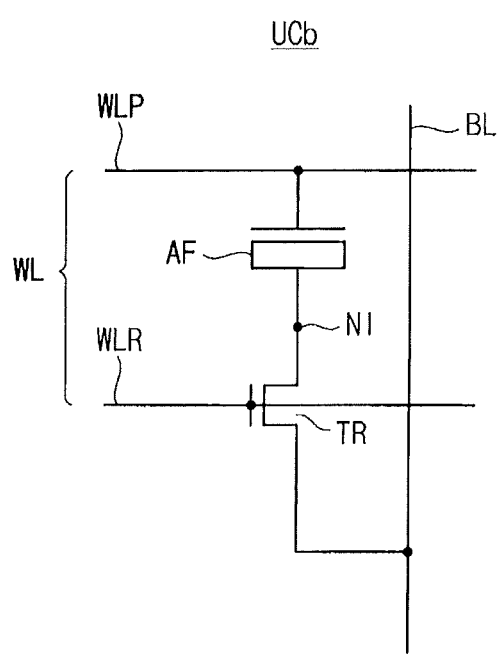
FIG. 8 is a circuit diagram illustrating another example of an OTP cell included in the OTP memory device of FIG. 5.

FIG. 8 is a circuit diagram illustrating another example of an OTP cell included in the OTP memory device of FIG. 5.

Referring to FIG. 8, an OTP memory cell UCb may include an antifuse AF and a read transistor TR.

The antifuse AF may be connected between a corresponding voltage word line WLP and an intermediate node NI. The read transistor TR may be connected between the intermediate node NI and a corresponding bit line BL, and a gate electrode of the read transistor TR may be connected to a corresponding read word line WLR.

The antifuse AF may be implemented with a metal oxide semiconductor (MOS) transistor. In an example embodiment, as illustrated in FIG. 8, a drain electrode and a source electrode of the MOS transistor AF may be connected to the intermediate node NI and a gate electrode of the MOS transistor AF may be connected to the voltage word line WLP.

The structure and the manufacturing process of the OTP memory cell UCb of FIG. 8 may be similar to those of FIG. 7, for example. To implement the MOS capacitor, a conduction path may be added to connect the second source region 123 and the second drain region 124 in FIG. 7.

Figure 9:
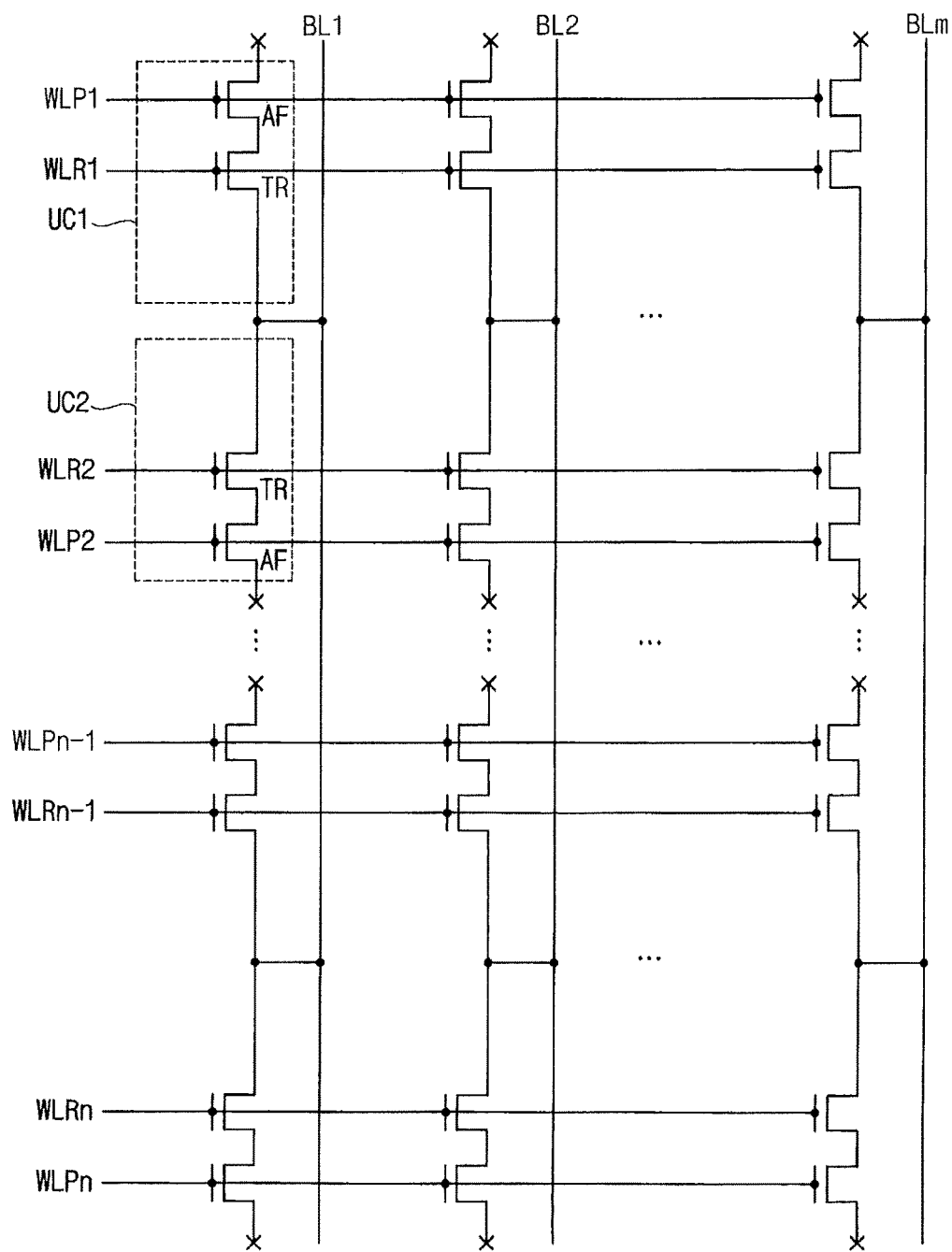
FIG. 9 is a circuit diagram illustrating an example of a memory cell array included in the OTP memory device of FIG. 5.

FIG. 9 is a circuit diagram illustrating an example of a memory cell array such as that included in the OTP memory device of FIG. 5.

Referring to FIG. 9, a memory cell array 110 may include a plurality of OTP memory cells UC1 and UC2 that are connected to a plurality of bit lines BL1~BLm, a plurality of voltage word lines WLP1~WLPn and a plurality of read word lines WLR1~WLRn, respectively, and arranged in an n*m matrix.

The gate electrode of the read transistor TR may be connected to the corresponding read word line WLRx (x=1~n) and the source electrode of the read transistor TR may be connected to the corresponding bit line BLy (y=1~m).

The first electrode of the antifuse AF may be connected to the corresponding word line WLPx and the second electrode of the antifuse AF may be connected to the drain electrode of the read transistor TR.

As described above, in example embodiments the antifuse AF may be a MOS transistor. The gate electrode or the first electrode of the MOS transistor AF may be connected to the corresponding voltage word line WLPx, the source electrode or the second electrode of the MOS transistor AF may be connected to the drain electrode of the read transistor TR and the drain electrode of the MOS transistor AF may be floated.

Each of the OTP memory cells UC1 and UC2 may include the antifuse AF, the read transistor TR and the cell switching transistor CTS. FIG. 9 illustrates a non-limiting example that two unit cells UC1 and UC2 form a pair and the arrangement of the unit cells may be implemented in other manners.

Hereinafter, a programming operation of the OTP memory cell according to example embodiments is described with reference to FIGS. 5 through 9.

In example embodiments, when programming a selected memory cell, which is connected to a selected voltage word line WLP1, a selected read word line WLR1 and a selected bit line BL1, a program voltage VPGM, which is a relatively high voltage, may be applied to the selected voltage word line WLP1 and a selection voltage, which is lower than the program voltage VPGM, may be applied to the selected read word line WLR1. A ground voltage 0V may be applied to non-selected voltage word lines WLP2, . . . , WLPn and non-selected read word lines WLR2, . . . , WLRn. The program permission voltage VPER (e.g., the ground voltage 0V) may be applied to the selected bit line BL1, and the program inhibition voltage VINH may be applied to non-selected bit lines BL2, . . . BLm. For example, the program voltage VPGM may be about 7V, and the selection voltage may be about 3V.

The selection voltage may be applied to the first gate 111 of the read transistor TR through the selected read word line WLR1, and the ground voltage 0V may be applied to the source region 113 of the read transistor TR through the selected bit line BL1. Therefore, the read transistor TR may be turned on and a voltage of the first drain 114 may be 0V. The program voltage VPGM may be applied to the second gate 121 of the antifuse AF through the selected voltage word line WLP1, and, as described above, the voltage of the second source region 123 of the antifuse AF, may be the ground voltage 0V. Therefore, an intensive electric field may be applied to the second gate insulation layer 122 of the antifuse AF1 to break down an insulating property of the second gate insulation layer 122 so that the selected memory cell is programmed.

The non-selected memory cells that are connected to the non-selected voltage word lines WLP2, . . . , WLPn and the non-selected read word lines WLR2, WLRn will not be inadvertently programmed because the ground voltage 0V is applied to both the non-selected voltage word lines WLP2, . . . , WLPn and the non-selected read word lines WLR2 so that intensive electric field is not applied to the second gate insulation layer 122. The non-selected memory cells that are connected to the selected voltage word line WLP1, the selected read word line WLR1 and the non-selected bit lines BL2, . . . , BLm will not be inadvertently programmed, either.

For example, an operation of the non-selected memory cell, which is connected to the selected voltage word line WLP1, the selected read word line WLR1 and the non-selected bit line BL2 may be described. The selection voltage may be applied to the selected read word line WLR1 and the program inhibition voltage VINH may be applied to the non-selected bit line BL2. A voltage difference between the first gate 111 of the read transistor TR and the first source region 113 of the read transistor TR may be zero so that the read transistor TR is turned off and the first drain region 114 of the read transistor TR is floated. Even though the program voltage VPGM is applied to the second gate 121 of the antifuse AF through the selected voltage word line WLP1, an intensive electric field will not be applied to the second gate insulation layer 122 of the antifuse AF because the second source region 123 of the antifuse AF is floated.

Figure 10:
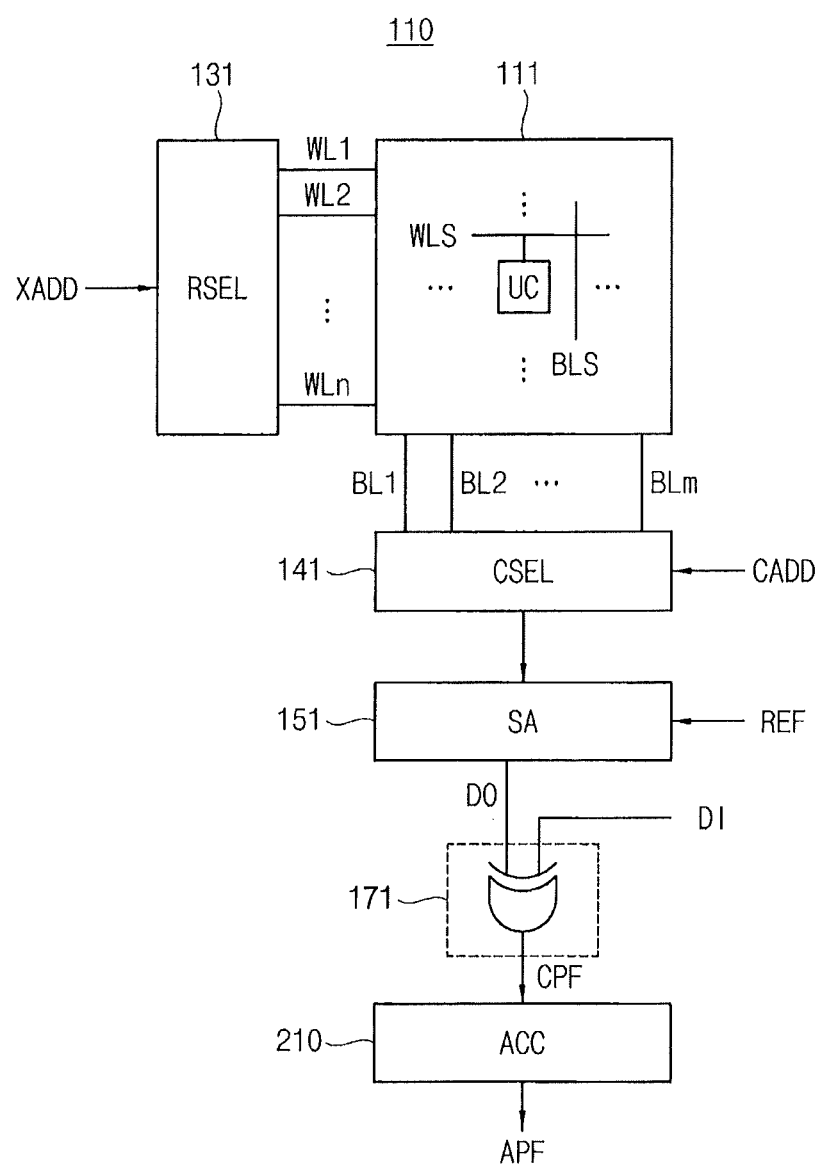
FIG. 10 is a block diagram illustrating an OTP memory device according to example embodiments.
Figure 11:
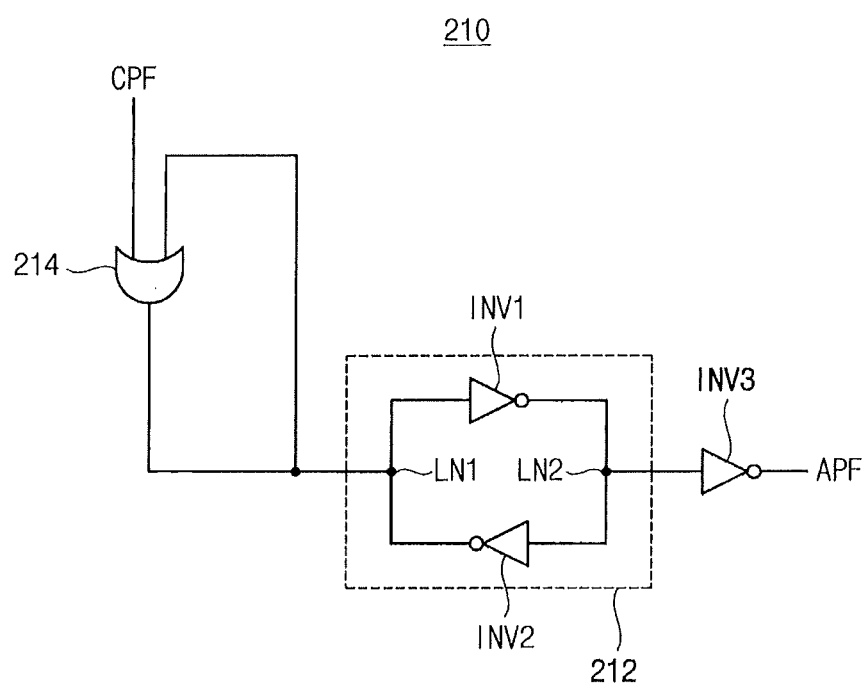
FIG. 11 is a circuit diagram illustrating an example embodiment of an accumulator included in the OTP memory device of FIG. 10.

FIG. 10 is a block diagram illustrating an OTP memory device according to example embodiments, and FIG. 11 is a circuit diagram illustrating an example embodiment of an accumulator such as may be included in the OTP memory device of FIG. 10.

Referring to FIG. 10, an OTP memory device 101 may include a memory cell array 111, a row selection circuit RSEL 131, a column selection circuit CSEL 141, a read sense amplifier SA 151, a verifying unit VER 171 and an accumulating unit ACC 210. The other components of the OTP memory device 101 are omitted for convenience of illustration and the repeated descriptions with FIGS. 5 and 9 will not be repeated here.

The above-described current program address CPAD may include a row address XADD applied to the row selection circuit 131 and a column address CADD applied to the column address 141. The row selection circuit 131 may select one word line WLs of the plurality of word lines WL1~WLn in response to the row address XADD. The column selection circuit 141 may select one bit line BLs of the plurality of bit lines BL1~BLm. The OTP memory cell UC connected to the selected word line WLs and the selected bit line BLs corresponds to the current program address CPAD.

The write driver (not shown) may program one OTP memory cell UC based on program data DI of one bit, with respect to the current program address CPAD. The read sense amplifier 151 may output read data DO of one bit for the program verification by reading out the stored value of the programmed one OTP memory cell UC.

The verifying unit 171 may generate a current verification result signal CPF by comparing the program data DI of one bit and the read data of one bit DO. In an example embodiment, as illustrated in FIG. 10, the verifying unit 171 may include an exclusive OR (XOR) logic gate configured to perform an XOR logic operation on the program data DI and the read data DO. When the program data DI is different from the read data DO, it corresponds to the program fail (that is, unsuccessful programming) and the current verification result signal CPF may have a first logic level (e.g., a logic high level). When the program data DI is equal to the read data DO, it corresponds to the program success (that is, successful programming) and the current verification result signal CPF may have a second logic level (e.g., a logic low level). The accumulating unit 210 may generate an accumulated verification result signal APF by accumulating, based on the current verification result signal CPF, the program verification results with respect to all of the OTP memory cells to be programmed.

Referring to FIG. 11, in example embodiments the accumulating unit 210 may include a latch 212 and a logic gate 214.

The latch 212 may include two inverters INV1 and INV2 that are cross-coupled between a first latch node LN1 and a second latch node LN2. For example, the stored value of the first latch node LN1 may correspond to the accumulated verification result signal APF. The accumulated verification result signal APF may be provided through an inverter INV3 coupled to the second latch node LN2 as illustrated in FIG. 11, or the accumulated verification result signal APF may be provided directly from the first latch node LN1, for example.

The logic gate 214 may perform a logic operation on the current verification result signal CPF representing the program verification result with respect to the current program address CPAD and the stored value of the first latch node LN1 and update the stored value of the first latch node LN1 based on a result of the logical operation. In example embodiments, the logic gate 214 may be implemented with an OR logic gate such that the current verification result signal CPF has the logic high level to represent a program fail (that is, a failed programming) and the logic low level to represent a program success (that is, a successful programming). Even though not illustrated in FIG. 11, the accumulating unit 210 may further include a reset transistor to initialize the stored value of the latch 212 and the first latch node LN1 may be initialized to the logic low level corresponding to the program success. Through such configuration, the stored value of the first latch node LN1 may maintain the logic low level corresponding to the program success until the current verification result signal CPF has the logic high level corresponding to the program fail. After the current verification result signal CPF has the logic high level, the first latch node LN1 may maintain the logic high level corresponding to the program fail regardless of the logic level of the current verification result signal CPF. As such, the program verification results may be accumulated using a latch and the accumulated verification result signal APF may be a one-bit signal having the first logic level when the program is failed with respect to at least one of the OTP memory cells and having the second logic level when the program is successful with respect to all of the OTP memory cells.

Figure 12:
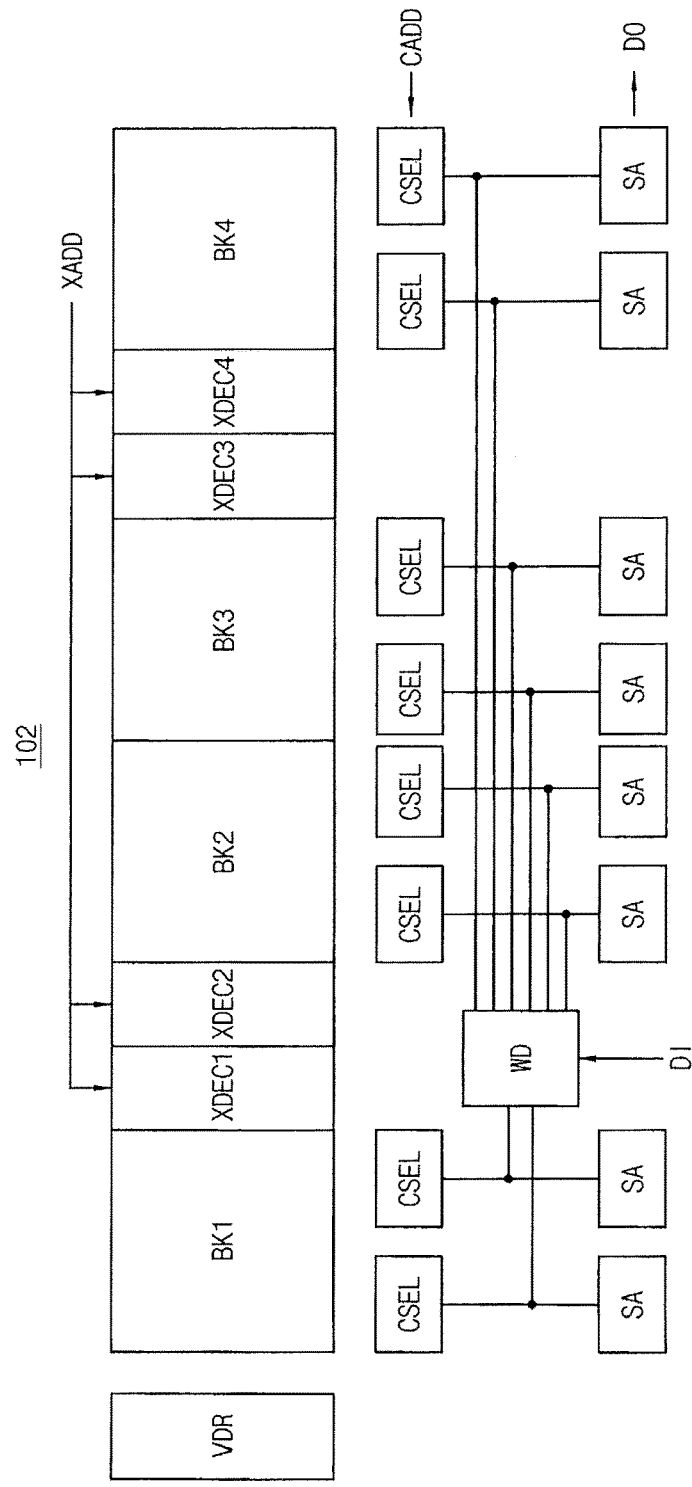
FIG. 12 is a block diagram illustrating an OTP memory device according to example embodiments.
Figure 13:
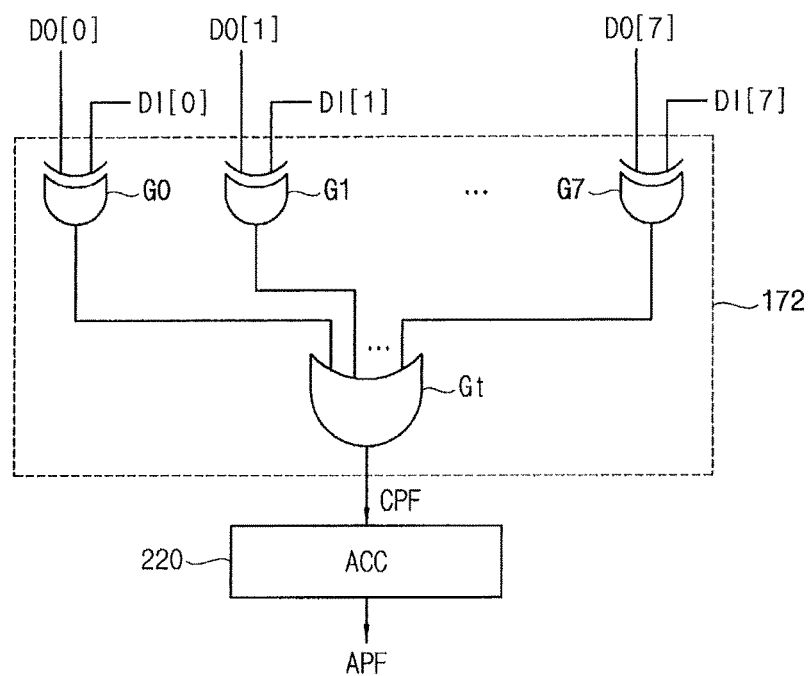
FIG. 13 is a diagram illustrating a verification circuit and an accumulator for the OTP memory device of FIG. 12.

FIG. 12 is a block diagram illustrating an OTP memory device according to example embodiments, and FIG. 13 is a diagram illustrating an example verification circuit and accumulator for the OTP memory device of FIG. 12.

Referring to FIG. 12, an OTP memory device 102 may include a memory cell array BK1~BK4, row selection circuits XDEC1~XDEC4 and VDR, column selection circuits CSEL and read-write circuits SA and WD.

As described with reference to FIG. 5, the memory cell array BK1~BK4 may include a plurality of OTP memory cells that are coupled to a plurality of bit lines BL and a plurality of word lines WL, respectively. As described above, the word lines WL may include voltage word lines WLP and read word lines WLR. The OTP memory cells in the memory cell array may form a plurality of memory banks BK1~BK4. FIG. 12 illustrates four memory banks BK1~BK4 for convenience of illustration, but the number of the memory banks may be changed.

In example embodiments, row selection circuits XDEC1~XDEC4 and VDR may include row decoders XDEC1~XDEC4 for selecting a word line WL corresponding to a row address and a voltage driver VDR for providing voltages applied to the word lines WL.

The column selection circuit CSEL may include a column gate circuit and a column decoder for selecting a bit line corresponding to a column address. The column decoder may generate column selection signals based on the column address and a column selection enable signal. The column gate circuit may include a plurality of switches that are turned on selectively in response to the column selection signals. The switch corresponding to the column address may be turned on to select the bit line BL.

The read-write circuits SA and WD may be connected to the bit lines BL via the column selection circuit CSEL. The read-write circuit SA and WD may include a read sense amplifier SA and a write driver WD. The read sense amplifier SA may perform a read operation for sensing the data stored in the OTP memory cells and providing the read data. The write driver WD may perform a write operation for storing the write data into the OTP memory cells. The write driver WD and the read sense amplifier SA may be formed inseparably or separably.

The OTP memory device 102 may program a plurality of bits, that is, a plurality of OTP memory cells in the memory banks BK1~BK4 simultaneously in the program mode. In some example embodiments, the OTP memory device 102 may select and enable one of the memory banks BK1~BK4 and program a plurality of OTP memory cells of a selected row in the selected memory bank simultaneously. In other example embodiments, the OTP memory device 102 may select and enable two or more memory banks of the memory banks BK1~BK4 and program a plurality of OTP memory cells of a selected row in the selected memory banks simultaneously. In still other example embodiments, the OTP memory device 102 may enable all of the memory banks BK1~BK4 and program OTP memory cells corresponding to the number of the memory banks BK1~BK4, that is, one OTP memory cell per memory bank, simultaneously.

The write driver WD may program N OTP memory cells based on program data DI of N bits where N is a positive integer greater than one, with respect to the current program address CPAD. The read sense amplifier SA may generate read data DO of N bits by reading out stored values of the programmed N OTP memory cells.

Referring to FIG. 13, the verifying unit 172 may include a plurality of logic gates G0~G7 configured to compare the program data DI[7:0] and the read data DO[7:0] and a logic gate Gt configured to generate the current verification result signal CPF. In an example embodiment, the logic gates G0~G7 for the comparison may be implemented with XOR logic gates and the logic gate Gt for the generation of the current verification result signal CPF may be implemented with an OR logic gate. FIG. 13 illustrates the eight logic gates G0~G7 for the comparison but the number of the logic gates may be changed variously according to the number of the read sense amplifiers SA in FIG. 12. The accumulating unit 220 may accumulate the program verification results based on the current verification result signal CPF to generate the accumulated verification result signal APF as described with reference to FIG. 11.

Figure 14:
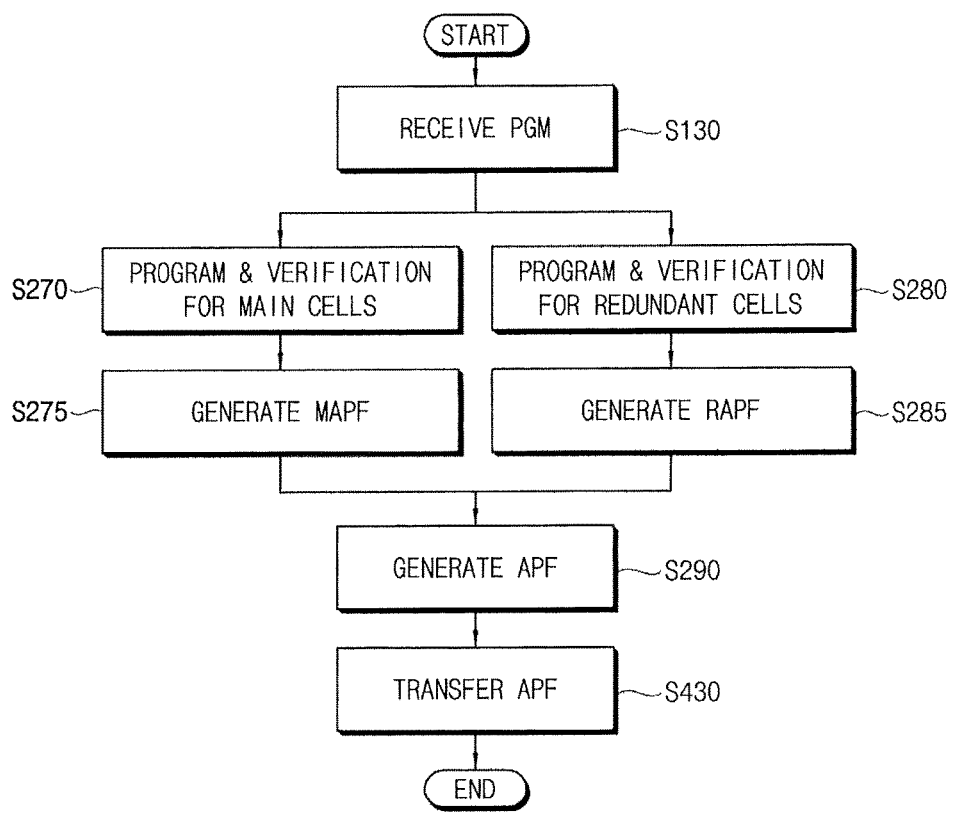
FIG. 14 is a flow chart illustrating a method of programming an OTP memory device according to example embodiments.

FIG. 14 is a flow chart illustrating a method of programming an OTP memory device according to example embodiments.

Referring to FIGS. 2 and 14, the OTP memory device 100 may receive the program command PGM from the tester 10 (S130). The OTP memory device 100 may receive a range of the program address, program data etc. with the program command PGM from the tester 10.

In example embodiments OTP memory device 100 includes a plurality of main cells and a plurality of redundant cells, as will be described below with reference to FIG. 15, and one main cell and one redundant cell corresponding to a same address may represent one bit.

The OTP memory device 100 may perform the program and the program verification with respect to the main cells (S270) and generate a main accumulated signal MAPF by accumulating the verification results with respect to the main cells (S275). OTP memory device 100 may also perform the program and the program verification with respect to the redundant cells (S280) and generate a redundant accumulated signal RAPF by accumulating the verification results with respect to the redundant cells (S285). The OTP memory device 100 may generate the above-described accumulated verification result signal APF by performing a logical operation on the main accumulated signal MAPF and the redundant accumulated signal RAPF (S290) and transfer the accumulated verification result signal APF to the tester 10 (S430). The same program data may be used with respect to the main cells and the redundant cells, but the program, the program verification and the accumulation of the program verification results with respect to the main cells may be performed independently from the program, the program verification and the accumulation of the program verification results with respect to the redundant cells. Efficiency and reliability of the program may be increased because the program may be completed if at least one of the main cell and the redundant cell is programmed successfully.

Figure 15:
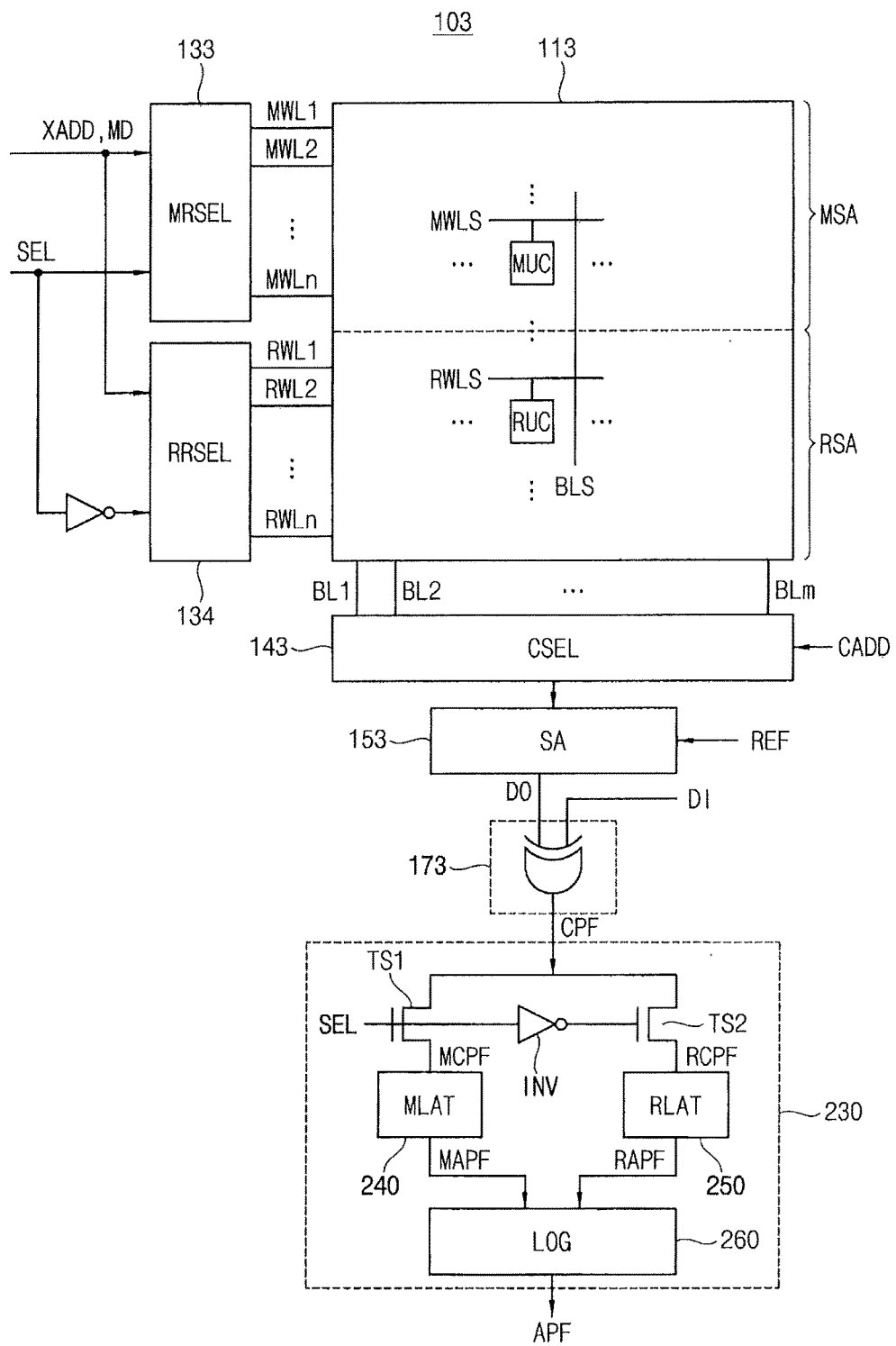
FIG. 15 is a block diagram illustrating an OTP memory device according to example embodiments.
Figure 16:
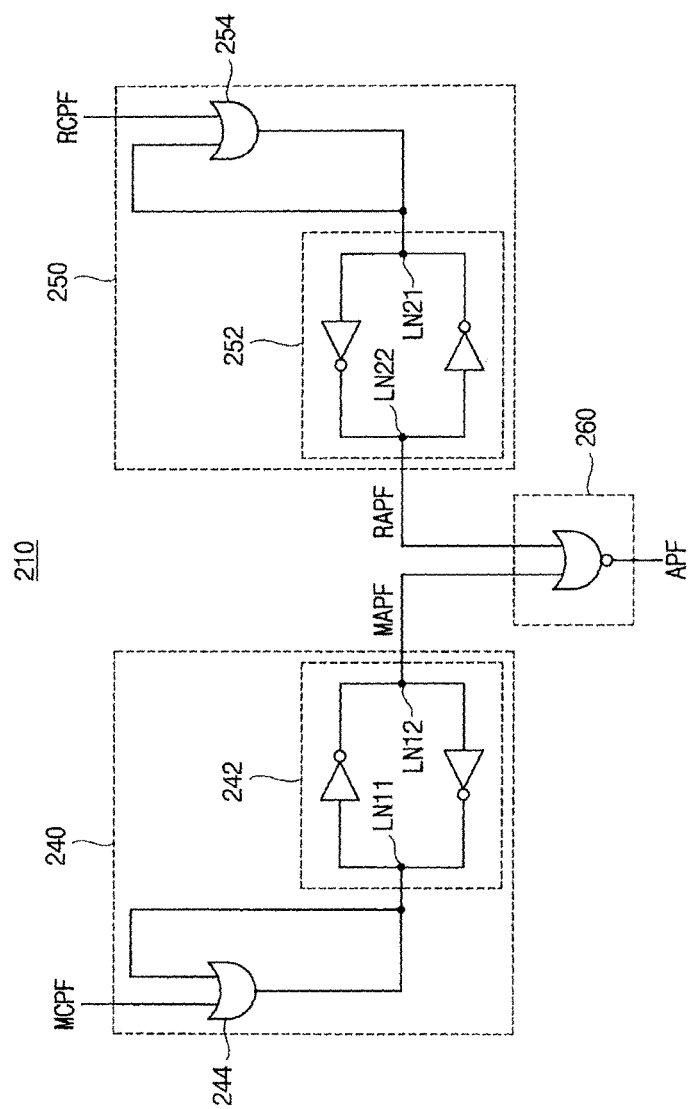
FIG. 16 is a circuit diagram illustrating an example embodiment of an accumulator included in the OTP memory device of FIG. 15.

FIG. 15 is a block diagram illustrating an OTP memory device according to example embodiments, and FIG. 16 is a circuit diagram illustrating an example embodiment of an accumulator such as included in the OTP memory device of FIG. 15.

Referring to FIG. 15, an OTP memory device 103 may include a memory cell array 113, a main row selection circuit MRSEL 133, a redundant row selection circuit RRSEL 134, a column selection circuit CSEL 143, a read sense amplifier SA 153, a verifying unit VER 173 and an accumulating unit ACC 230. The other components of the OTP memory device 101 are omitted for convenience of illustration and the detailed descriptions with FIGS. 5 and 9 will not be repeated here.

The memory cell array 113 may include a main sub array MSA of the main cells MUC and a redundant sub array RSA of the redundant cells RUC. As illustrated in FIG. 15, the one main cell MUC and the one redundant cell RUC corresponding to the same address are respectively connected to a main word line MWLS and a redundant word line RWLS and commonly connected to a same bit line BLS.

The main word line MWLS and the redundant word line RWLS corresponding to the same address may be activated simultaneously during normal read and activated independently during program and the program verification processes. For such operations, the controller 160 in FIG. 5 may provide a selection signal SEL indicating the main sub array MSA or the redundant sub array RSA and a mode signal MD indicating the normal read mode or the program mode. When the mode signal MD indicates the program mode, one of the main sub array MSA and the redundant sub array RSA may be enabled in response to the selection signal SEL. When the mode signal MD indicates the normal read mode, both of the main sub array MSA and the redundant sub array RSA may be enabled simultaneously regardless of the selection signal SEL. In the program mode, the same program data are written in the main sub array MSA and the redundant sub array RSA, respectively. In the normal read mode, the one main cell MUC and the one redundant cell RUC corresponding to the same address may be selected simultaneously to output the read data of one bit, thereby enhancing reliability of the program.

The above-described current program address CPAD may include a row address XADD applied to the row selection circuits 133 and 134 and a column address CADD applied to the column address 143. When the selection signal SEL indicates the main sub array MSA, the redundant row selection circuit 134 may be disabled and the main row selection circuit 133 may select one main word line MWLS of the plurality of main word lines MWL1~MWLn in response to the row address XADD. When the selection signal SEL indicates the redundant sub array RSA, the main row selection circuit 133 may be disabled and the redundant row selection circuit 134 may select one redundant word line RWLS of the plurality of redundant word lines RWL1~RWLn in response to the row address XADD. The column selection circuit 143 may select one bit line BLS of the plurality of bit lines BL1~BLm. The OTP memory cells MUC and RUC respectively connected to the selected main word line MWLS and the selected redundant word line RWLS and commonly connected to the selected bit line BLS correspond to the current program address CPAD.

The write driver (not shown) may program one OTP memory cell MUC or RUC based on program data DI of one bit, with respect to the current program address CPAD. The read sense amplifier 153 may output read data DO of one bit for the program verification by reading out the stored value of the programmed one OTP memory cell MUC or RUC.

The verifying unit 173 may generate a current verification result signal CPF by comparing the program data DI of one bit and the read data of one bit DO. In an example embodiment, as illustrated in FIG. 15, the verifying unit 173 may include an exclusive OR (XOR) logic gate configured to perform an XOR logic operation on the program data DI and the read data DO. When the program data DI is different from the read data DO, it corresponds to the program fail (that is, failed programming) and the current verification result signal CPF may have a first logic level (e.g., a logic high level). When the program data DI is equal to the read data DO, it corresponds to the program success (that is, successful programming) and the current verification result signal CPF may have a second logic level (e.g., a logic low level). The accumulating unit 230 may generate an accumulated verification result signal APF by accumulating, based on the current verification result signal CPF, the program verification results with respect to all of the OTP memory cells to be programmed.

Referring to FIGS. 15 and 16, the accumulating unit 230 may include a selection unit, a main accumulating unit MLAT 240, a redundant accumulating unit RLAT 250 and a logic unit LOG 260.

The selection unit may include a first switch TS1, a second switch TS2 and an inverter INV configured to transfer the current verification result signal CPF to one of the main accumulating unit 240 and the redundant accumulating unit 250 in response to the selection signal SEL. When the selection signal SEL indicates the main sub array MSA, the first switch TS1 is turned on and the second switch is turned off to transfer the current verification result signal CPF as a main current verification result signal MCPF to the main accumulating unit 240. When the selection signal SEL indicates the redundant sub array RSA, the first switch TS1 is turned off and the second switch is turned on to transfer the current verification result signal CPF as a redundant current verification result signal RCPF to the redundant accumulating unit 250.

The main accumulating unit 240 may include a first latch 242 and a first logic gate 244. The first latch 242 may include two inverters that are cross-coupled between a first latch node LN11 and a second latch node LN12. The first logic gate 244 may perform a logic operation on the main current verification result signal MCPF and the stored value of the first latch node LN11 and update the stored value of the first latch node LN11 based on a result of the logical operation. In an example embodiment, the first logic gate may be implemented with an OR logic gate 244 as described with reference to FIG. 11.

The redundant accumulating unit 250 may include a second latch 252 and a second logic gate 254. The second latch 252 may include two inverters that are cross-coupled between a third latch node LN21 and a fourth latch node LN22. The second logic gate 254 may perform a logic operation on the redundant current verification result signal RCPF and the stored value of the third latch node LN21 and update the stored value of the third latch node LN21 based on a result of the logical operation. In an example embodiment, the second logic gate 254 may be implemented with an OR logic gate as described with reference to FIG. 11.

The logic unit 260 may perform a logic operation on the main accumulated signal MAPF from the second latch node LN12 and the redundant accumulated signal RAPF from the fourth latch node LN22 to generate the accumulated verification result signal APF. As illustrated in FIG. 16, the logic unit 260 may be implemented with a NOR logic gate.

Program verification results may be accumulated using the latches 242 and 252 and the accumulated verification result signal APF may be a one-bit signal having the first logic level when the program is failed with respect to at least one data bit programmed in the OTP memory cells and having the second logic level when the program is successful with respect to all data bits programmed in the OTP memory cells.

Figure 17:
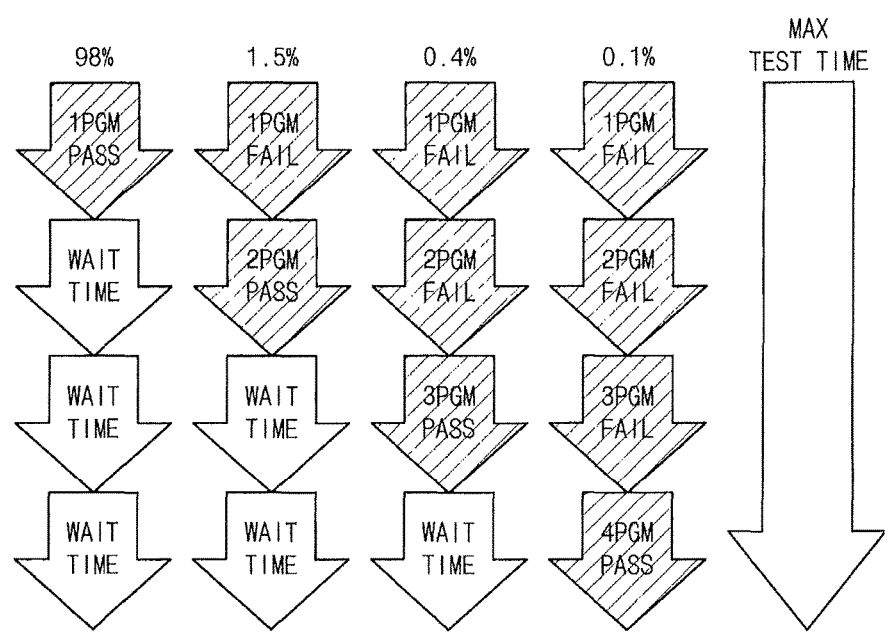
FIG. 17 is a diagram for test times according to example embodiments.

FIG. 17 is a diagram illustrating test times according to example embodiments.

To increase yield of the OTP memory device and/or the semiconductor integrated circuit including the OTP memory device, the program may be repeated until the program is determined to be successful, within the maximum program count MPC. That is, attempts at programming may be repeated until programming is successful, unless a maximum number of attempts, represented by the value of MPC, has been reached. For example, as illustrated in FIG. 17, 98% of the OTP memory cells may be programmed by one program operation, 1.5% of the OTP memory cells may be programmed by two program operations, 0.4% of the OTP memory cells may be programmed by three program operations and 0.1% of the OTP memory cells may be programmed by four program operations. In this case, the maximum program count MPC may be set to four. Conventionally, programming is controlled inside the semiconductor integrated circuit including the OTP memory device and the tester does not recognize when the programming is completed. As a result, the tester stands by for an excessive wait time, waiting for a predetermined time (four programming periods in this example), even if the OTP has been successfully programmed in one, two, or three programming attempts, for example. According to example embodiments, in contrast, the program verification results are accumulated to provide the accumulated information to the tester and, in this example, the tester may wait for one, two, three, or four programming periods, depending upon the desired yield of 98%, 99.5%, 99.9%, or 100%, respectively. Accordingly efficiency in programming the OTP memory device may be enhanced and test time of the semiconductor integrated circuit including the OTP memory device may be reduced.

Figure 18:
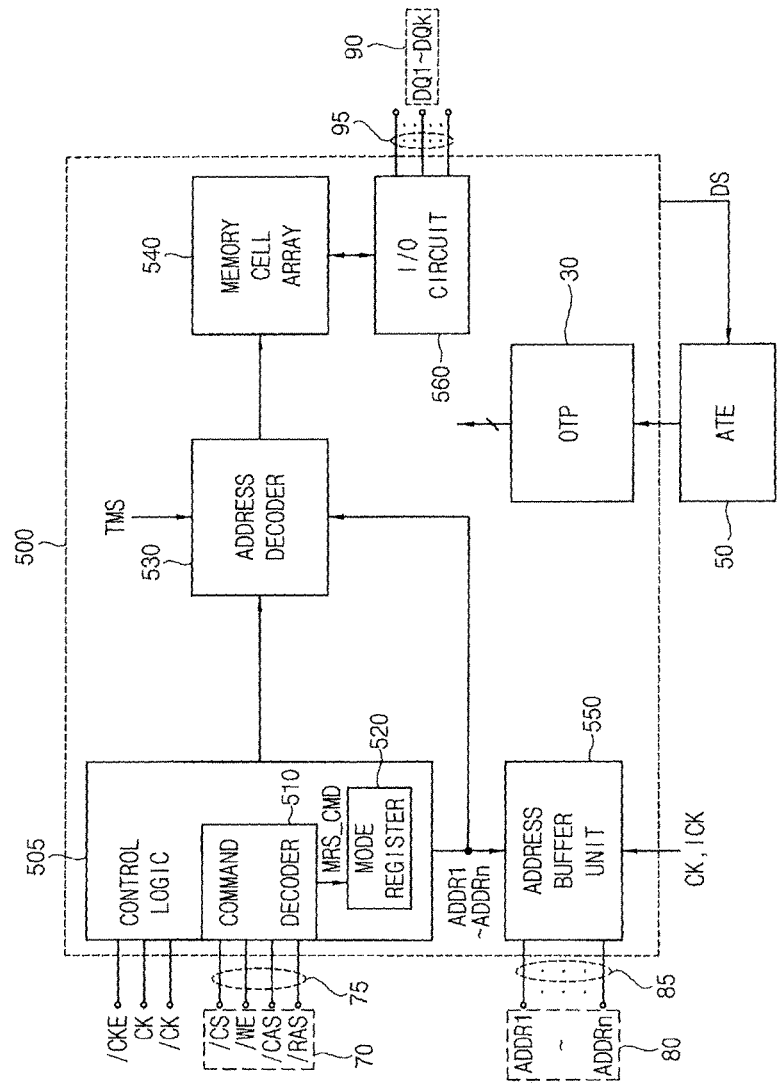
FIG. 18 is a block diagram illustrating a memory device including an OTP memory device according to example embodiments.

FIG. 18 is a block diagram illustrating a memory device including an OTP memory device according to example embodiments.

Referring to FIG. 18, a semiconductor memory device 500 may include control logic 505, an address decoder 530, a memory cell array 540, an address buffer unit 550, an input/output (I/O) unit 560 and an OTP memory device 30.

The control logic 505 receives control signals 70 through command pins 75, receives an address signal 80 through address pins 85, and controls the address decoder 430 which accesses the memory cell array 540 based on commands and the address signal. The control signals 70 include a chip selection signal /CS, a write enable signal /WE, a column address strobe signal /CAS, and a row address strobe signal /RAS. The address signal 30 includes ADDR1~ADDRn. The combination of the control signals /CS, /WE, /CAS, and /RAS designate the command. In addition, in some embodiments, the control logic 505 may also receive a clock enable signal /CKE, a clock signal CK, and an inverted clock signal /CK.

The address buffer unit 550 receives the address signal 80 through the address pins 85, and provides the address signal ADDR1~ADDRn to the control logic 505 and the address decoder 430 in synchronization with the clock signal CK or the inverted clock signal /CK.

The I/O unit 560 provides data 90 to the memory cell array 540 or receives the data 90 from the memory cell array 540 through the data pins 95. The data 90 includes DQ1~DQk.

The control logic 505 includes a command decoder 510 and a mode register 520. The command decoder 510 decodes the command designated by the control signals /CS, /WE, /CAS, and /RAS to provide a mode register set (MRS) command MRS_CMD to the mode register 420. The mode register 520 sets an operation mode of the semiconductor memory device 500 in response to the MRS command MRS_CMD. The operation mode of the semiconductor memory device 500 may include a test mode, MRS mode, TMRS mode and a normal operation mode.

In the test mode, an external tester ATE 50 may program required data in the OTP memory device 30. The programmed data may be used to control the semiconductor memory device 500. As described above, the OTP memory device 30 include a latch for accumulating the program verification results and provides an output signal APF to external tester ATE 50 as an indication of when programming is complete. Efficiency of the program may be enhanced and the test time may be reduced by accumulating the program verification results and providing the accumulated information to the tester 50.

Figure 19:
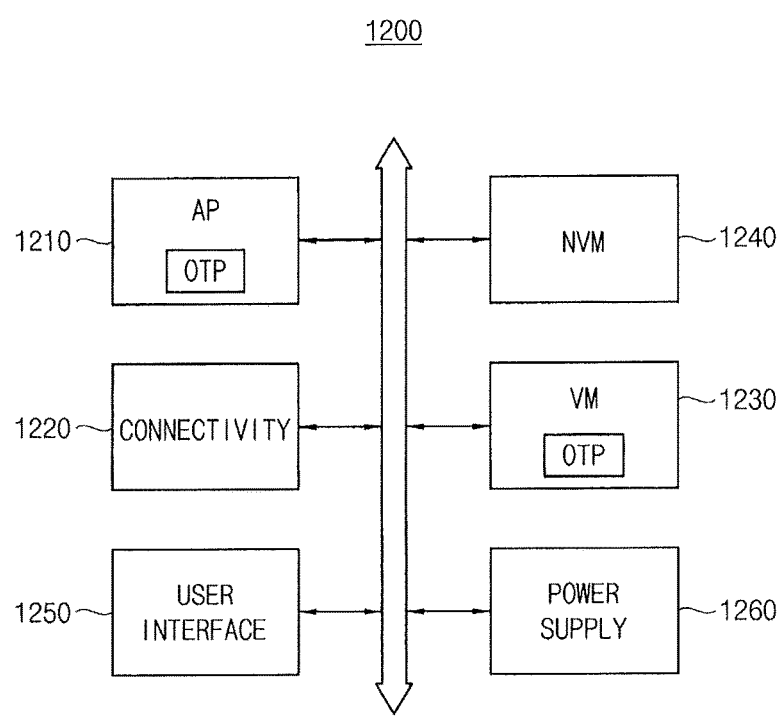
FIG. 19 is a block diagram illustrating a mobile system including an OTP memory device according to example embodiments.

FIG. 19 is a block diagram illustrating a mobile system including an OTP memory device according to example embodiments.

Referring to FIG. 19, a mobile system 1200 includes an application processor 1210, a connectivity unit 1220, a volatile memory device (VM) 1230, a nonvolatile memory device 1240, a user interface 1250, and a power supply 1260. In some embodiments, the mobile system 1200 may be a mobile phone, a smart phone, a personal digital assistant (PDA), a portable multimedia player (PMP), a digital camera, a music player, a portable game console, a navigation system, or another type of electronic device.

The application processor 1210 may execute applications such as a web browser, a game application, a video player, etc. In some embodiments, the application processor 1210 may include a single core or multiple cores. For example, the application processor 1210 may be a multi-core processor such as a dual-core processor, a quad-core processor, a hexa-core processor, etc. The application processor 1210 may include an internal or external cache memory.

The connectivity unit 1220 may perform wired or wireless communication with an external device. For example, the connectivity unit 1220 may perform Ethernet communication, near field communication (NFC), radio frequency identification (RFID) communication, mobile telecommunication, memory card communication, universal serial bus (USB) communication, etc. In some embodiments, connectivity unit 1220 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 1230 may store data processed by the application processor 1210, or may operate as a working memory. For example, the volatile memory device 1230 may be a dynamic random access memory, such as DDR SDRAM, LPDDR SDRAM, GDDR SDRAM, RDRAM, etc.

The application processor 1210 and/or the volatile memory device 1230 may include a OTP memory device in accordance with principles of inventive concepts. As described above, the OTP memory device may include a latch for accumulating the program verification results. Efficiency of the program may be enhanced and the test time may be reduced by accumulating the program verification results and providing the accumulated information to an external device such as a tester.

The nonvolatile memory device 1240 may store a boot image for booting the mobile system 1200. For example, the nonvolatile memory device 1240 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

In some embodiments, the mobile system 1200 and/or components of the mobile system 1200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), wafer-level processed stack package (WSP), etc.

Figure 20:
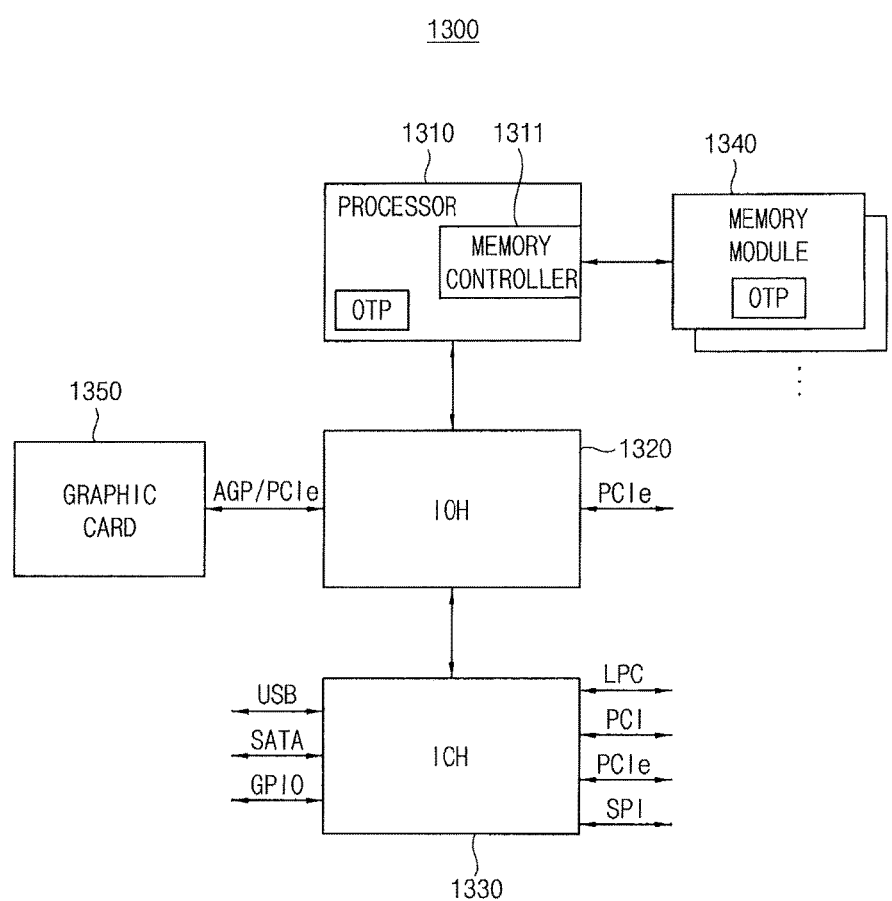
FIG. 20 is a block diagram illustrating a computing system including an OTP memory device according to example embodiments.

FIG. 20 is a block diagram illustrating a computing system including an OTP memory device according to example embodiments.

Referring to FIG. 20, a computing system 1300 includes a processor 1310, an input/output hub (IOH) 1320, an input/output controller hub (ICH) 1330, at least one memory module 1340, and a graphics card 1350. In some embodiments, the computing system 1300 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 1310 may perform various computing functions such as executing specific software for performing specific calculations or tasks. For example, the processor 1310 may be a microprocessor, a central process unit (CPU), a digital signal processor, or the like. In some embodiments, the processor 1310 may include a single core or multiple cores. For example, the processor 1310 may be a multi-core processor, such as a dual-core processor, a quad-core processor, a hexa-core processor, etc. Although FIG. 20 illustrates the computing system 1300 including one processor 1310, in some embodiments, the computing system 1300 may include a plurality of processors. The processor 1310 may include an internal or external cache memory.

The processor 1310 may include a memory controller 1311 for controlling operations of the memory module 1340. The memory controller 1311 included in the processor 1310 may be referred to as an integrated memory controller (IMC). A memory interface between the memory controller 1311 and the memory module 1340 may be implemented with a single channel including a plurality of signal lines, or may bay be implemented with multiple channels, to each of which at least one memory module 1340 may be coupled. In some embodiments, the memory controller 1311 may be located inside the input/output hub 1320, which may be referred to as memory controller hub (MCH).

The processor 1310 and/or the memory module 1340 may include an OTP memory device in accordance with principles of inventive concepts. As described above, the OTP memory device may include a latch for accumulating the program verification results. Efficiency of the program may be enhanced and the test time may be reduced by accumulating the program verification results and providing the accumulated information to a tester.

The input/output hub 1320 may manage data transfer between processor 1310 and devices, such as the graphics card 1350. The input/output hub 1320 may be coupled to the processor 1310 via various interfaces. For example, the interface between the processor 1310 and the input/output hub 1320 may be a front side bus (FSB), a system bus, a HyperTransport, a lightning data transport (LDT), a QuickPath interconnect (QPI), a common system interface (CSI), etc. Although FIG. 19 illustrates the computing system 1300 including one input/output hub 1320, in some embodiments, the computing system 1300 may include a plurality of input/output hubs. The input/output hub 1320 may provide various interfaces with the devices. For example, the input/output hub 1320 may provide an accelerated graphics port (AGP) interface, a peripheral component interface-express (PCIe), a communications streaming architecture (CSA) interface, etc.

The graphic card 1350 may be coupled to the input/output hub 1320 via AGP or PCIe. The graphics card 1350 may control a display device (not shown) for displaying an image. The graphics card 1350 may include an internal processor for processing image data and an internal memory device. In some embodiments, the input/output hub 1320 may include an internal graphics device along with or instead of the graphics card 1350 outside the graphics card 1350. The graphics device included in the input/output hub 1320 may be referred to as integrated graphics. Further, the input/output hub 1320 including the internal memory controller and the internal graphics device may be referred to as a graphics and memory controller hub (GMCH).

The input/output controller hub 1330 may perform data buffering and interface arbitration to efficiently operate various system interfaces. The input/output controller hub 1330 may be coupled to the input/output hub 1320 via an internal bus, such as a direct media interface (DMI), a hub interface, an enterprise Southbridge interface (ESI), PCIe, etc. The input/output controller hub 1330 may provide various interfaces with peripheral devices. For example, the input/output controller hub 1330 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 1310, the input/output hub 1320 and the input/output controller hub 1330 may be implemented as separate chipsets or separate integrated units. In other embodiments, at least two of the processor 1310, the input/output hub 1320 and the input/output controller hub 1330 may be implemented as a single chipset.

As such, the method of programming the OTP memory device and the method of testing the semiconductor memory device including the OTP memory device according to example embodiments may enhance efficiency in programming the OTP memory device and reduce a test time of the semiconductor integrated circuit including the OTP memory device by accumulating the program verification results using a relatively small accumulator, such as a latch, to provide the accumulated result to an external device such as a tester.

Inventive concepts may be applied to arbitrary devices and systems including an OTP memory device for storing non-volatile data. For example, inventive concepts may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts. Accordingly, all such modifications are intended to be included within the scope of inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of testing a semiconductor integrated circuit including a one-time programmable (OTP) memory device, the method comprising:
   transferring a program command from a tester to the OTP memory device;
   performing program and program verification steps with respect to OTP memory cells in the OTP memory device in response to the program command;
   the OTP memory device generating an accumulated verification result signal by accumulating program verification results with respect to the OTP memory cells;
   transferring the accumulated verification result signal from the OTP memory device to the tester; and
   the tester determining whether to reprogram the OTP memory cells based on the accumulated verification result signal.

2. The method of claim 1, wherein the accumulated verification result signal is a one-bit signal having a first logic level when the program is failed with respect to at least one of the OTP memory cells and having a second logic level when the program is successful with respect to all of the OTP memory cells.

3. The method of claim 1, wherein determining the reprogram of the OTP memory cells includes:
when the accumulated verification result signal has a first logic level, comparing a current program count with a maximum program count;
when the current program count is smaller than the maximum program count, retransferring the program command from the tester to the semiconductor integrated circuit; and
when the current program count is equal to the maximum program count, determining a failure of the OTP memory cells programming.

4. The method of claim 3, wherein determining the reprogram of the OTP memory cells further includes:
when the accumulated verification result signal has a second logic level, determining a success of the OTP memory cells programming.

5. The method of claim 1, wherein generating the accumulated verification result signal includes:
accumulating the program verification results using a latch.

6. The method of claim 1, wherein the program, the program verification and the accumulation of the program verification results are performed sequentially with changing a current program address.

7. The method of claim 6, wherein generating the accumulated verification result signal includes:
performing a logical operation on a current verification result signal and a stored value of a latch, the current verification result signal representing the program verification result with respect to the current program address, the stored value corresponding to the accumulated verification result signal; and
updating the stored value of the latch based on a result of the logical operation.

8. The method of claim 6, wherein performing the program and the program verification steps includes:
with respect to the current program address, programing one OTP memory cell based on program data of one bit;
generating read data of one bit by reading out a stored value of the programmed one OTP memory cell; and
generating the current verification result signal by comparing the program data of one bit and the read data of one bit.

9. The method of claim 6, wherein performing the program and the program verification steps includes:
with respect to the current program address, programing N OTP memory cells based on program data of N bits where N is a positive integer greater than one;
generating read data of N bits by reading out stored values of the programmed N OTP memory cells;
comparing the program data of N bits and the read data of N bits; and
generating the current verification result signal by performing a logical operation on the comparison result.

10. The method of claim 1, wherein the OTP memory cells include main cells and redundant cells, and one main cell and one redundant cell corresponding to a same address represent one bit.

11. The method of claim 10, wherein generating the accumulated verification result signal includes:
generating a main accumulated signal by accumulating the verification results with respect to the main cells; and
generating a redundant accumulated signal by accumulating the verification results with respect to the redundant cells.

12. The method of claim 11, wherein generating the accumulated verification result signal further includes:
generating the accumulated verification result signal by performing a logical operation on the main accumulated signal and the redundant accumulated signal.

13. The method of claim 12, wherein the accumulated verification result signal represents a program success when at least one of the main accumulated signal and the redundant accumulated signal represents a program success.

14. The method of claim 10, wherein the one main cell and the one redundant cell corresponding to the same address are respectively connected to a main word line and a redundant word line and commonly connected to a same bit line, and
wherein the main word line and the redundant word line corresponding to the same address are activated simultaneously during normal read and activated independently during the program and the program verification.

15. A method of programming a one-time programmable (OTP) memory device, the method comprising:
performing a program and a program verification step with respect to OTP memory cells in the OTP memory device in response to a program command received from an external device;
generating an accumulated verification result signal by accumulating program verification results with respect to the OTP memory cells at the OTP memory device; and
transferring the accumulated verification result signal from the OTP memory device to the external device.

16. A method of programming an integrated circuit that includes one-time programmable memory, comprising:
the integrated circuit attempting to program the one-time programmable memory up to a predetermined maximum number of times in response to a command from test equipment; and
the integrated circuit providing an indication of successful programming to the test equipment before the maximum number of programming attempts have been executed.

17. The method of claim 16, further comprising:
the test equipment proceeding with further testing when the indication of successful programming is received from the integrated circuit.

18. The method of claim 16, further comprising:
the integrated circuit providing an indication of failed programming to the test equipment when the maximum number of programming attempts have been executed without successfully programming the integrated circuit.

19. The method of claim 16, wherein the integrated circuit determines the success or failure of a programming operation by comparing programming data to data read back from a memory cell that the integrated circuit attempted to program with the data.

20. The method of claim 16, wherein the indication of successful programming is a one-bit signal.

* * * * *